(12) United States Patent
Salama et al.

(10) Patent No.: US 8,288,682 B2
(45) Date of Patent: Oct. 16, 2012

(54) FORMING MICRO-VIAS USING A TWO STAGE LASER DRILLING PROCESS

(75) Inventors: Islam Salama, Chandler, AZ (US); Yonggang Li, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 1280 days.

(21) Appl. No.: 11/863,895

(22) Filed: Sep. 28, 2007

(65) Prior Publication Data

US 2009/0084755 A1    Apr. 2, 2009

(51) Int. Cl.
*B23K 26/38*    (2006.01)

(52) U.S. Cl. .................................. 219/121.71

(58) Field of Classification Search ............ 219/121.7, 219/121.71
See application file for complete search history.

(56) References Cited

U.S. PATENT DOCUMENTS

| | | | |
|---|---|---|---|
| 6,713,719 B1* | 3/2004 | De Steur et al. | 219/121.71 |
| 6,864,459 B2* | 3/2005 | Chang et al. | 219/121.71 |
| 2001/0025415 A1* | 10/2001 | Kawamoto et al. | 219/121.71 |
| 2001/0045974 A1* | 11/2001 | Shoemaker et al. | 264/400 |
| 2002/0170891 A1* | 11/2002 | Boyle et al. | 219/121.67 |
| 2006/0046461 A1* | 3/2006 | Benson et al. | 438/612 |
| 2006/0157272 A1* | 7/2006 | Jones | 174/262 |

FOREIGN PATENT DOCUMENTS

| | | | |
|---|---|---|---|
| EP | 500110 A1 * | 8/1992 | |
| GB | 2337720 A * | 12/1999 | |
| JP | 4-359491 A * | 12/1992 | |
| JP | 10-173318 A * | 6/1998 | |
| JP | 11-254171 A * | 9/1999 | |
| JP | 2002-217551 A * | 8/2002 | |
| JP | 2003-236690 A * | 8/2003 | |
| JP | 2005-21917 A * | 1/2005 | |
| JP | 2005-28369 A * | 2/2005 | |
| JP | 2005-205469 A * | 8/2005 | |
| JP | 2006-21242 A * | 1/2006 | |
| JP | 2007-29990 A * | 2/2007 | |

(Continued)

OTHER PUBLICATIONS

Machine translation of Japan Patent document 10-173,318, Sep. 2011.*

(Continued)

*Primary Examiner* — Geoffrey S Evans
(74) *Attorney, Agent, or Firm* — Grossman, Tucker, Perreault & Pfleger, PLLC

(57) ABSTRACT

A method for forming at least one micro-via on a substrate is disclosed. The method comprises drilling at least one hole in a substrate by using a first laser beam. The first laser beam has an energy distribution, which is more at edges of the first laser beam than at the center of the first laser beam. The method further comprises forming at least one blank pattern on a top surface of the substrate and around an outer periphery of the at least one hole by removing at least a portion of the substrate by using a second laser beam. At least one blank pattern of the plurality of blank pattern corresponds to pad of the at least one micro-via. Thereafter, the method comprises filling the plurality of blank patterns and the at least one micro-via with a conductive material to form at least micro-via.

18 Claims, 4 Drawing Sheets

FOREIGN PATENT DOCUMENTS

JP          2007-90438 A  *  4/2007

OTHER PUBLICATIONS

Machine translation of Japan Patent document No. 2005-205,469, Sep. 2011.*

Machine translation of Japan Patent document No. 2007-29,990, Sep. 2011.*

Kim, Dae-Jin et al., "Laser Cleaning Technology of the Contact Hole for Semiconductor Manufacturing", Proceedings of the SPIE—The International Society for Optical Engineering, vol. 5063, Issue 1, 2003, P53-56.

Cruz, M. P. et al., "Si(100) Waters Cleaned by Laser Ablation", International Journal of Modern Physics B, vol. 18, No. 23-24 (2004) 3169-3176.

* cited by examiner

US 8,288,682 B2

FORMING MICRO-VIAS USING A TWO STAGE LASER DRILLING PROCESS

FIELD OF THE DISCLOSURE

The present disclosure generally relates to integrated circuits, and, more particularly, to a method for forming micro-vias on a substrate.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, reference has to be made to the following detailed description, including the appended claims, in connection with the above-described drawings. Although the present disclosure is described in connection with exemplary embodiments, the present disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

A preferable method to form micro-vias in a substrate of an integrated circuit (IC) is a laser drilling process. The laser drilling process forms micro-vias in the substrate by removing substrate material from the substrate. The substrate may comprise a polymer build-up material such as an Ajinomoto Build-up Film (ABF). Further, the micro-vias are plated with a conductive material to define a conductive path through the micro-via. The laser drilling process enables forming micro-vias on the substrate with a fine pitch, such as less than 100 micrometers (μm). Preferably, conventional methods for forming micro-vias on a substrate use a Carbon Dioxide ($CO_2$) laser or an Ultraviolet (UV) laser to remove the substrate material from the substrate. A laser beam in the $CO_2$ laser or the UV laser may have various beam profiles. The beam profiles represent spatial energy distribution at various spatial locations of the laser beam. For example, the laser beam may have a Gaussian beam profile in which a greater energy is distributed at the center of the laser beam compared to an outer ring of the laser beam. The Gaussian beam profile is further explained in conjunction with FIG. 1A in the following section. Alternatively, the laser beam may have a top-hat beam profile, which has a uniform spatial energy distribution across the laser beam.

Figure 1A:
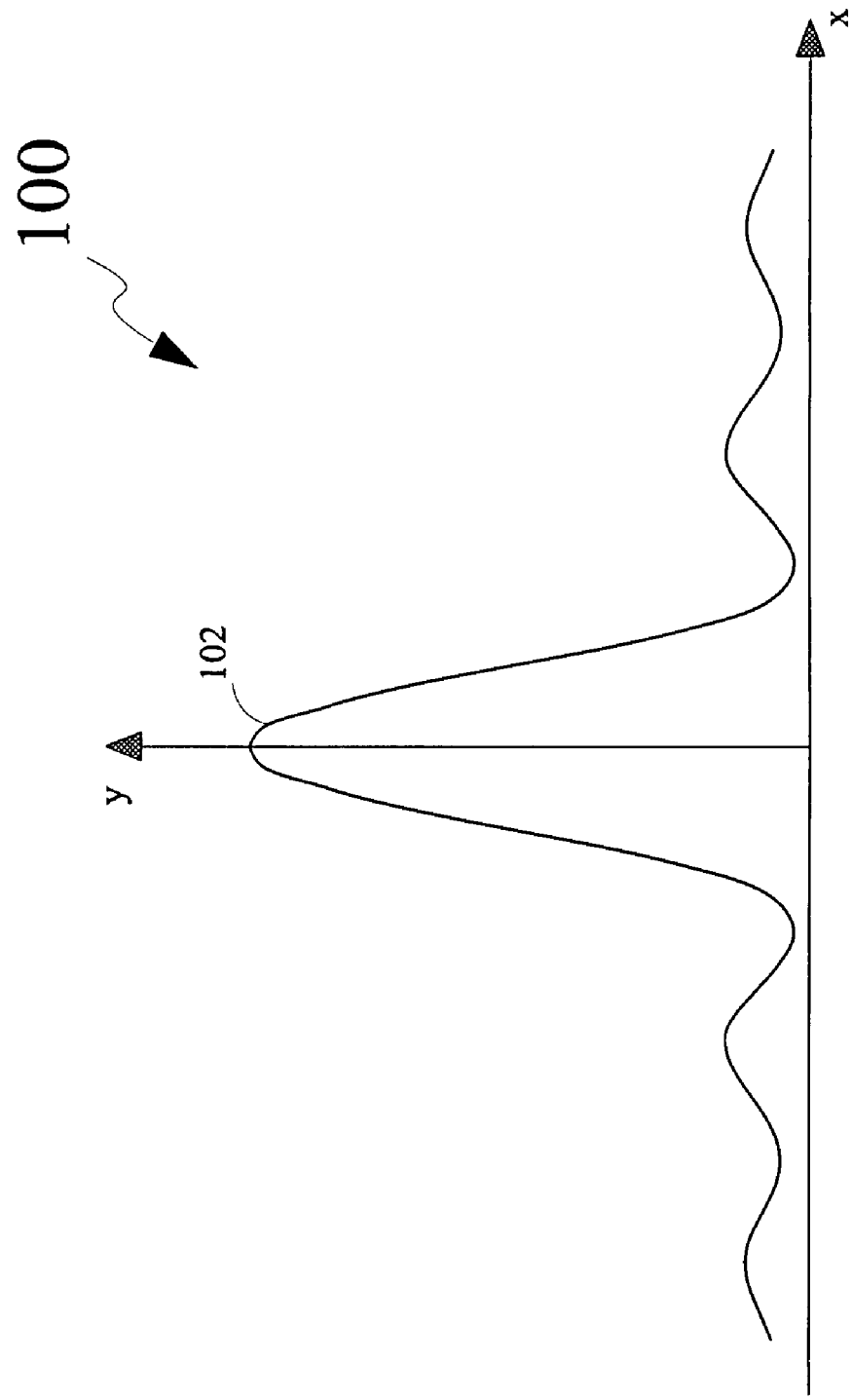
FIG. 1A illustrates a plot of spatial energy distribution of a laser beam used in a conventional method for forming micro-vias on a substrate.

FIG. 1A illustrates a plot 100 of spatial energy distribution of a laser beam 102 used in a conventional method for forming micro-vias on a substrate. The plot 100 represents variation of the spatial energy (Y-axis) with respect to the spatial location (X-axis) in the laser beam. The laser beam 102 has a Gaussian beam profile. It is evident from the plot 100 that the spatial energy of the laser beam 102 is greater at the center of the laser beam 102 than at outer ring (edges) of the laser beam 102. Therefore, the spatial energy distribution of the laser beam 102 is non-uniform. Accordingly, the intensity of the laser beam 102 is greater at the center of the laser beam 102, which causes a higher temperature at the center of the laser beam 102 than the edges. Additionally, due to convection or conduction of heat from the edges of the laser beam 102 towards the center of the laser beam 102, the temperature at the center of the laser beam 102 rises further. Therefore, due to uneven spatial energy distribution of the laser beam 102, the resulting micro-vias may have more residues or smears of substrate material at the corners of a bottom portion of the micro-vias than at the center portion, which is further explained in conjunction with FIG. 1B.

Figure 1B:
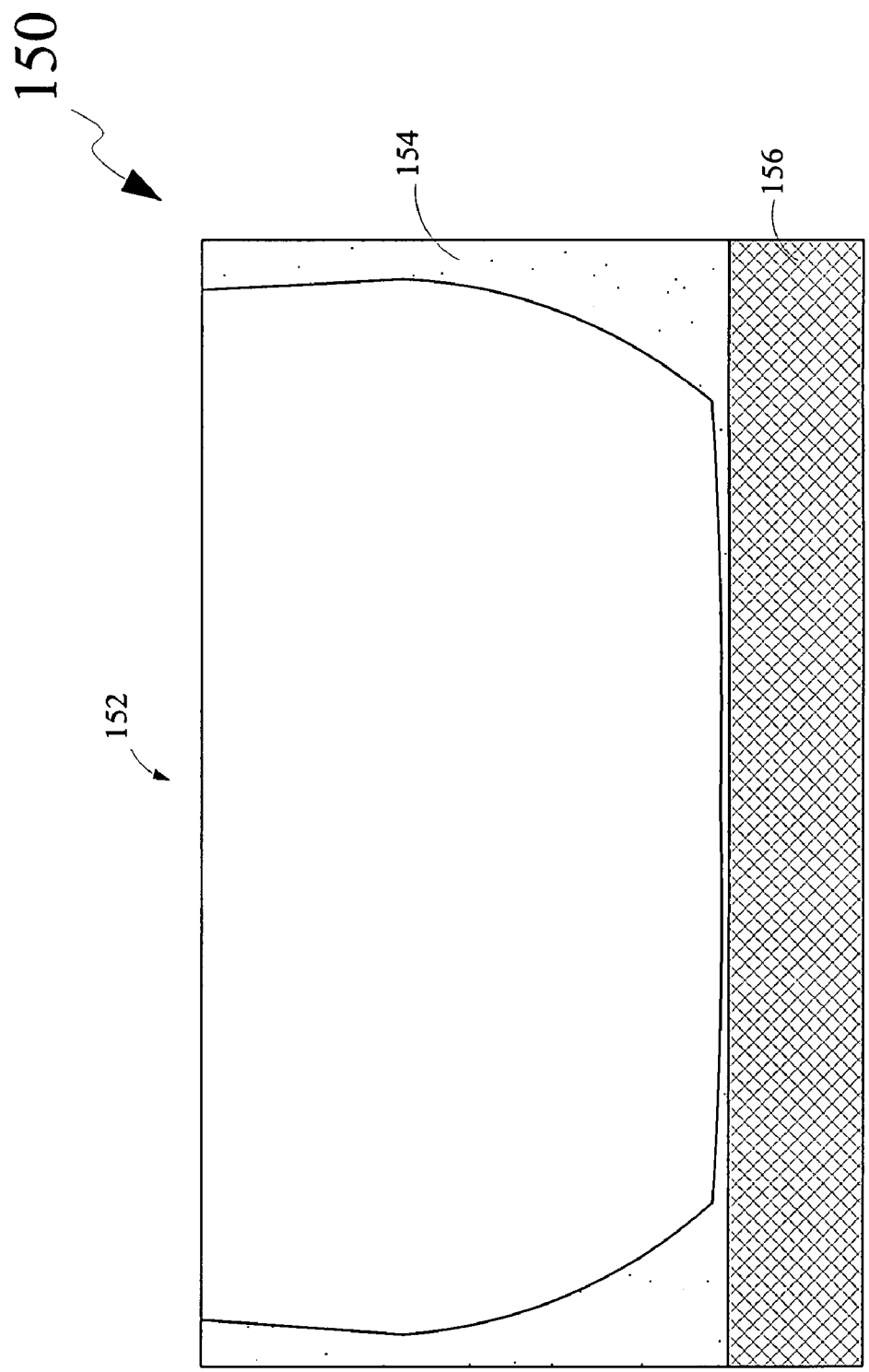
FIG. 1B illustrates a sectional view of a substrate comprising a micro-via formed by using a conventional method for forming micro-vias on the substrate.

FIG. 1B illustrates a sectional view of a substrate 150 comprising a micro-via 152 formed by using a conventional $CO_2$ laser or UV laser having a Gaussian beam profile, such as the laser beam 102. The micro-via 152 is formed by drilling a hole in the substrate 150 by using the laser beam 102. The hole is plated with a conductive material to configure the micro-via 152. Further, the substrate 150 is provided with a metal layer 156 below the substrate 150. The non-uniform energy distribution of the laser beam 102 causes more heating on a center portion than on an outer ring of a region specific to the hole of the micro-via 152, on the substrate 150 where the laser beam 102 is applied. As a result, a residue 154 of the substrate material of the substrate 150 is left in the hole of the micro-via 152. More specifically, the residue 154 is left primarily at the corners of the bottom portion of the hole of the micro-via 152, as shown in FIG. 1B.

The presence of the residue 154 at the corners of the bottom portion of the hole of the micro-via 152 may adversely affect the deposition of the conductive material on the peripheral surface of the hole of the micro-via 152. The poor deposition of the conductive material in the hole may result in a poor electrical conductivity of the micro-via 152 configured from the hole. Therefore, it is necessary to remove the residue 154 prior to depositing the conductive material on the peripheral surface of the hole of the micro-via 152. Preferably, the residue 154 in the hole may be removed by applying a de-smearing process. The de-smearing process involves a wet chemical cleaning of the hole to remove the residue 154.

The present disclosure provides a method for forming micro-vias in a substrate of an IC. The method utilizes a laser beam having a spatial energy distribution adapted to reduce the formation of a residue in the micro-vias. The present disclosure further provides a method that avoids the need for a chemical de-smearing process to remove the residue in the micro-vias.

Figure 2A:
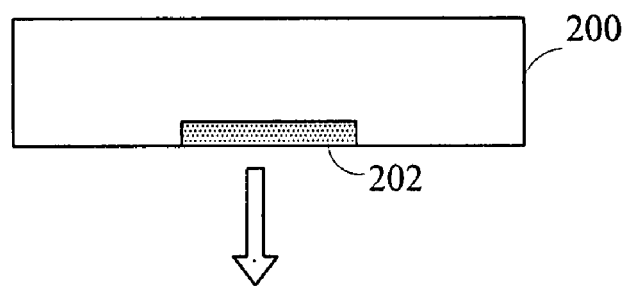
FIGS. 2A through to 2D illustrate various stages of a method for forming micro-vias on a substrate, according to an exemplary embodiment of the present disclosure.

FIGS. 2A through 2D illustrate various stages of a method for forming micro-vias on a substrate 200, according to an exemplary embodiment of the present disclosure. In a first stage of the method for forming micro-vias, the substrate 200 is provided and a metal layer 202 is formed below the substrate 200, as illustrated in FIG. 2A. Optionally, the substrate 200 may also be laminated on the metal layer 202. The metal layer 202 may comprise a conductive pattern formed thereon. It will be obvious to a person skilled in the art that the conductive pattern on the metal layer 202 may be formed by using any conventional lithographic process. Further, the substrate 200 may comprise materials including, but not limited to, a polymer build-up material such as an Ajinomoto Build-up Film (ABF).

Figure 2B:
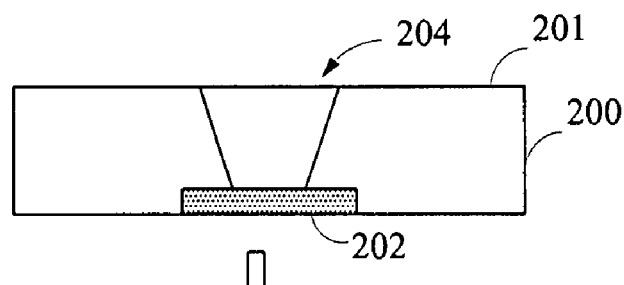

In a second stage of the method for forming the micro-vias on the substrate 200, a hole 204 may be drilled in the substrate 200, as illustrated in FIG. 2B. The hole 204 may be drilled by using a pitchfork laser beam (not shown). The pitchfork laser beam has a greater spatial energy distribution along edges of the laser beam, which is described in detail in conjunction with FIG. 3. The depth of hole 204 extends from a top surface 201 of the substrate 200 to the metal layer 202. The hole 204 is further processed in subsequent stages, described in conjunction with FIGS. 2C and 2D, to form the micro-vias in the substrate 200. A residue (not shown) of substrate material of the substrate 200 may be formed at a bottom of the hole 204. However, the spatial energy distribution of the pitchfork laser beam reduces a formation of the residue at corners of the bottom of the hole 204. More specifically, the residue left at the corners of the bottom of the hole 204 is reduced, as the spatial energy of the pitchfork laser beam is distributed more toward the edges of the laser beam than at the center of the laser beam.

Figure 2C:
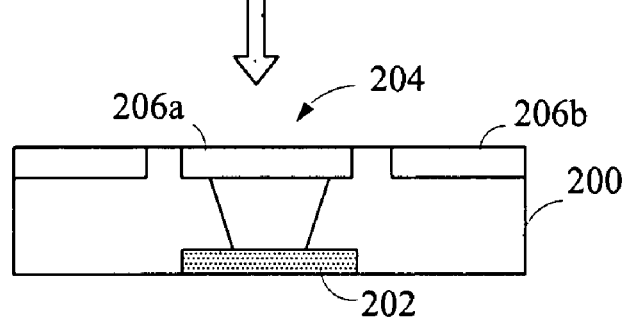

In a third stage of the method for forming micro-vias on the substrate 200, the substrate 200 is applied with a laser projection patterning (LPP) process, as illustrated in FIG. 2C. The LPP process comprises forming blank pattern 206a on the top surface 201 of the substrate 200 by using an excimer laser beam (not shown). More specifically, the blank pattern 206a is formed around a top portion of the hole 204. The blank pattern 206a has a depth and defines a micro-via pad (not shown) for the micro-vias. The excimer laser beam is applied at the top surface 201 of the substrate 200 to ablate the substrate material from the top surface 201. As a result, the blank pattern 206a is formed having the depth. Further, while forming the blank patterns 206a, the excimer laser beam is also utilized to remove any residue of the substrate material at the bottom of the hole 204. The excimer laser is concentrated at the bottom of the hole 204 to ablate any residue of the substrate material remaining in the hole 204. In an embodiment of the present disclosure, blank patterns 206b may also be formed on the top surface 201 of the substrate 200 along with the blank patterns 206a, which may act as other contact points on the substrate 200.

The LPP process may be utilized for forming the blank patterns 206a and 206b on the substrate 200. For example, a high power excimer laser beam may be applied on the top surface 201 of the substrate 200 through a mask plate (not shown). The mask plate has a pattern (not shown) corresponding to the blank patterns 206a and 206b on the substrate 200. The pattern is projected on the top surface 201 of the substrate 200 with a pre-fixed demagnification ratio of the laser beam in the LPP process. The mask plate and the substrate 200 move synchronously according to the pre-fixed demagnification ratio. The excimer laser beam scans across the mask plate to project the pattern on the top surface 201 of the substrate 200. The excimer laser beam has high energy that is capable of ablating the substrate material to form blank patterns 206a and 206b on the substrate 200. In an embodiment of the present disclosure, the excimer laser beam may also have a Gaussian beam profile, as described in conjunction with plot 102 of FIG. 1A. In another embodiment of the present disclosure, the excimer laser may have the top-hat beam profile.

Figure 2D:
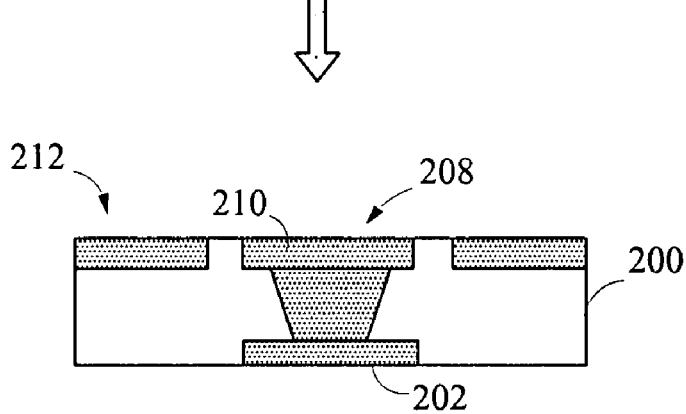

In a final stage of method for forming micro-vias on the substrate 200, the blank pattern 206a and the hole 204 are metallized, as illustrated in FIG. 2D. The blank pattern 206a and the hole 204 are deposited with a conductive material, such as Copper (Cu). However, it will be obvious to a person skilled in the art that any other conductive material may also be used for metallization. Further, the hole 204 filled with the conductive material forms the micro-via (also represented as '208' in FIG. 2D). The micro-via 208 comprises a micro-via pad 210 and the hole 204 filled with the conductive material. The micro-via pad 210 is configured by filling the blank pattern 206a with the conductive material. The micro-via pad 210 provides electrical connectivity to the metal layer 202 through the hole 204, which is also filled with the conductive material. In an embodiment of the present disclosure, the blank patterns 206b may also be filled with the conductive material to configure contact points 212 on the substrate 200. The contact points 212 may comprise conductive traces, conductive pads, conductive interconnections or the like.

It should be noted that any conventional plating technique may be used for filling the conductive material in the blank patterns 206a and 206b and the hole 204. For example, a damascene plating process may be utilized to deposit Copper in the blank patterns 206a and 206b and the hole 204. However, the present disclosure is not limited to the use of damascene plating process only and any other plating process may be utilized.

Figure 3:
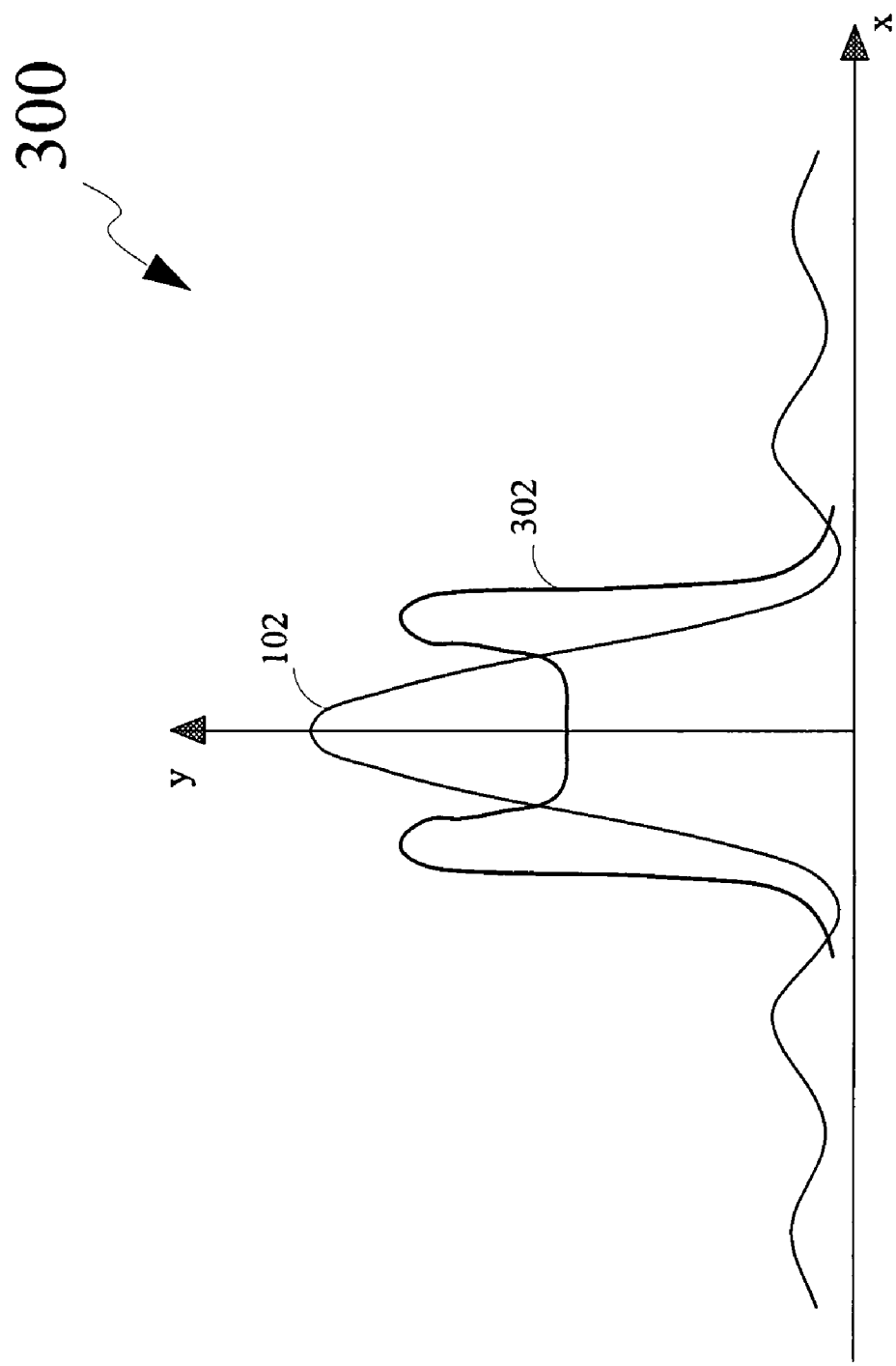
FIG. 3 illustrates a plot providing a comparison of a spatial energy distribution of a laser beam used in a conventional method for forming micro-vias on a substrate and a laser beam used in a method for forming micro-vias on a substrate, according to an exemplary embodiment of the present disclosure.

FIG. 3 illustrates a plot 300 providing a comparison of a spatial energy distribution of the laser beam 102 and the laser beam 302. The laser beam 302 is the pitchfork laser beam, used in conjunction with FIG. 2B. The plot 300 illustrates that the spatial energy distribution of the laser beam 302 is concentrated more at the edges of the laser beam 302 as compared to a central portion of the laser beam 302. The laser beam 302 may be obtained by reshaping a conventional $CO_2$ or UV laser beam such as the laser beam 102, into a pitchfork laser beam, using a specially designed beam shaping optic system. The beam shaping optic system may comprise a diffractive or a refractive optic system or a combination of both.

As described earlier, the laser beam 302 has more spatial energy distribution at the edges of the laser beam 302 than at the center of the laser beam 302. As a result, laser beam 302 causes more heating of the substrate material at the corners of the desired area of the hole 204 than at the center of the desired area of hole 204. Accordingly, the hole 204 formed by the laser beam 302 has less residue of the substrate material as compared to the hole formed by the laser beam 102 to configure the micro-via 152 in the substrate 150. Referring back to FIG. 3, it is evident that the laser beam 302 has greater spatial energy distribution along the peripheral edges of the laser beam 302 as compared to the laser beam 102. Therefore, the formation of the residue in the hole 204 in the substrate 200 is less as compared to that in the hole of the micro-via 152 of the substrate 150.

Various embodiments of the present disclosure offer following advantages. The use of a pitchfork laser beam, such as the laser beam 302, to form a hole 204 in the substrate 200 reduces the formation of residue at the bottom of the hole 204.

More specifically, the residue formed at the corners of the bottom of the hole 204 is substantially reduced. As a result of the reduced residue formation, the deposition of the conductive material in the hole 204 is more uniform and continuous. Therefore, the micro-via 208, formed after deposition of the conductive material in the hole 204, has an improved electrical conductivity over the micro-via formed by conventional processes.

Further, the residue left at the bottom of the hole 204, i.e., at the center of the bottom of the hole 204, is removed by the excimer laser used in the LPP process. The present disclosure utilizes a second laser beam that is the excimer laser, to remove the residue formed at the bottom of the hole 204. The excimer laser is also used to form blank patterns 206a and 206b on the substrate 200. The use of the excimer laser beam eliminates the need of the de-smearing process on the substrate 200 to remove the residue of the substrate material. Therefore, the present disclosure provides an improved method for forming reliable micro-via 208 on the substrate 200. Further, the method has reduced processing steps since the method dispenses with the need of a separate de-smearing process to remove the residue of the substrate material.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A method, comprising:
    drilling at least one hole in a substrate by using a first laser beam, wherein the first laser beam has a greater spatial energy distribution at edges of the first laser beam than at the center of the first laser beam;
    forming at least one blank pattern on a top surface of the substrate and around an outer periphery of the at least one hole by removing at least a portion of the substrate, the at least one blank pattern having a depth formed by using a second laser beam;
    removing residue of the substrate material at the bottom of the hole using the second laser beam while forming the at least one blank pattern; and
    filling the at least one blank pattern and the at least one hole with a conductive material.

2. The method of claim 1, wherein the second laser beam is an excimer laser beam.

3. The method of claim 2, wherein the second laser beam has a greater spatial energy distribution at the center of the second laser beam than at the edges of the second laser beam.

4. The method of claim 2, wherein the second laser beam has a uniform spatial energy distribution.

5. The method of claim 1, wherein the at least one blank pattern corresponds to at least one contact point on the substrate.

6. The method of claim 5, wherein the at least one contact point on the substrate configures at least one conductive trace on the substrate.

7. The method of claim 5, wherein the at least one contact point on the substrate configures at least one conductive pad on the substrate.

8. The method of claim 1, wherein providing the substrate comprises laminating the substrate over a metal layer.

9. The method of claim 1, wherein the at least one blank pattern corresponds to at least one micro-via pad.

10. A method, comprising:
    drilling at least one hole in a substrate by using a first laser beam, wherein the first laser beam has a greater spatial energy distribution at edges of the first laser beam than at the center of the first laser beam;
    forming at least one blank pattern on a top surface of the substrate and around an outer periphery of the at least one hole by removing at least a portion of the substrate, the at least one blank pattern having a depth formed by using a second laser beam;
    removing residue of the substrate material at the bottom of the hole using the second laser beam while forming the at least one blank pattern;
    filling the at least one blank pattern and the at least one hole with a conductive material; and
    removing, by said second laser beam, residue formed at the bottom of the hole.

11. The method of claim 10, wherein the second laser beam is an excimer laser beam.

12. The method of claim 11, wherein the second laser beam has a greater spatial energy distribution at the center of the second laser beam than at the edges of the second laser beam.

13. The method of claim 11, wherein the second laser beam has a uniform spatial energy distribution.

14. The method of claim 10, wherein the at least one blank pattern corresponds to at least one contact point on the substrate.

15. The method of claim 14, wherein the at least one contact point on the substrate configures at least one conductive trace on the substrate.

16. The method of claim 14, wherein the at least one contact point on the substrate configures at least one conductive pad on the substrate.

17. The method of claim 10, wherein providing the substrate comprises laminating the substrate over a metal layer.

18. The method of claim 10, wherein the at least one blank pattern corresponds to at least one micro-via pad.

* * * * *